(12) United States Patent
Endo

(10) Patent No.: US 8,085,111 B2
(45) Date of Patent: Dec. 27, 2011

(54) THIN FILM BALUN

(75) Inventor: Makoto Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 231 days.

(21) Appl. No.: 12/461,248

(22) Filed: Aug. 5, 2009

(65) Prior Publication Data
US 2010/0045396 A1 Feb. 25, 2010

(30) Foreign Application Priority Data

Aug. 20, 2008 (JP) .................................. 2008-211644

(51) Int. Cl.
*H03H 7/42* (2006.01)
*H01P 3/08* (2006.01)

(52) U.S. Cl. .......................................... 333/26; 333/246
(58) Field of Classification Search .................... 333/25, 333/26, 246
See application file for complete search history.

(56) References Cited

U.S. PATENT DOCUMENTS

| 6,683,510 | B1* | 1/2004 | Padilla | 333/25 |
| 7,256,663 | B2* | 8/2007 | Yasuda et al. | 333/26 |
| 7,629,860 | B2* | 12/2009 | Liu et al. | 333/25 |
| 7,663,448 | B2* | 2/2010 | Harada et al. | 333/26 |
| 7,800,465 | B2* | 9/2010 | Kimura et al. | 333/204 |
| 2009/0237176 | A1* | 9/2009 | Endo | 333/25 |
| 2011/0012690 | A1* | 1/2011 | Endo | 333/25 |

FOREIGN PATENT DOCUMENTS

JP B2-3780414 5/2006

* cited by examiner

*Primary Examiner* — Dean O Takaoka
(74) *Attorney, Agent, or Firm* — Oliff & Berridge, PLC

(57) ABSTRACT

A thin film balun includes: an unbalanced transmission line which includes two coils; a balanced transmission line which includes two coils and is electromagnetically coupled to the unbalanced transmission line; a capacitor having one end connected to the balanced transmission line; and a ground terminal connected to the other end of the capacitor. The capacitor is disposed in a region which does not overlap a coil included in the unbalanced transmission line and a coil included in the balanced transmission line.

4 Claims, 7 Drawing Sheets

THIN FILM BALUN

BACKGROUND OF THE INVENTION

1. Field of the Invention

The present invention relates to a balun that performs unbalanced-to-balanced signal conversion, and more particularly to a thin film balun formed by a thin film process which is advantageous for miniaturization and thickness reduction.

2. Description of the Related Art

Radio communication apparatuses include various high frequency elements such as antenna, filter, RF switch, power amplifier, RF-IC and balun. Here, resonant elements such as antenna and filter handle unbalanced signals relative to the ground potential; however, RF-IC, which produces or processes high frequency signals, handles balanced signals. Thus, in connecting the two types of elements, a balun is used which functions as an unbalanced-to-balanced signal converter.

Sometimes a balanced signal needs to be amplified by applying a bias to a balun used in mobile communication equipment such as mobile-phone and wireless LAN. In this case, between the balanced transmission line of the balun and the ground terminal, a capacitor must be connected in series which has a capacitance which allows the intended frequency signal to flow to GND, so that the DC component and the intended frequency component are separated.

As a balun having such function, Japanese Patent No. 3780414 discloses a laminated balun which has a capacitor disposed between a balanced transmission line and GND terminal of the balun. This laminated balun is formed by using LTCC (Low Temperature Co-fired Ceramics) technique, and the capacitor is formed over the whole area.

To meet the recent demands for miniaturization and thickness reduction of electronic devices, the present inventor has made a diligent study on characteristics of a balun including the related art bias supply capacitor. As a result, it was found that, in a thin film balun formed by a thin film process, the related art bias supply capacitor affects balanced transmission characteristics of the balun. It is expected that this is caused by a structural factor that thin film baluns have a short interlaminar distance between the capacitor and balanced transmission line, compared to laminated baluns. However, it became clear that, as long as the structure of the related art laminated balun is used, various characteristics required by thin film baluns cannot be further improved to a satisfactory level.

To address the above problem, the present invention has been devised, and its object is to provide a thin film balun which, while incorporating a capacitor used to supply a DC bias, allows improvement in balanced transmission characteristics.

SUMMARY OF THE INVENTION

To achieve the above object, a thin film balun according to the present invention includes: an unbalanced transmission line which includes a pair of first coil sections; a balanced transmission line which includes a pair of second coil sections and is magnetically coupled to the unbalanced transmission line; a capacitor having one end connected to the balanced transmission line; and a ground terminal connected to the other end of the capacitor, wherein the capacitor is disposed in a region which does not overlap the first coil sections and the second coil sections.

With this structure, some points are still unclear concerning details of operation mechanism by which balanced transmission characteristics (a phase balance and an amplitude balance) of thin film balun are improved. However, it is expected that, since the capacitor is disposed in the region which does not overlap the first coil sections and the second coil sections, the influence on magnetic coupling of the unbalanced transmission line and balanced transmission line are reduced compared with the influence exerted thereon when the capacitor is disposed to overlap the coil sections and, therefore, the balanced transmission characteristics of the thin film balun are improved. Here, the region which does not overlap the first coil sections and the second coil sections concerns a matter of whether an overlapping is observed as seen from a facing direction of the first coil sections and the second coil sections. Coil openings are not included in this region. An arrangement region of the capacitor is specified by two capacitor electrodes disposed to be opposed to each other. A leading wire for connecting the capacitor electrodes to a desired terminal is not included in the arrangement region.

Preferably, the capacitor is connected to the balanced transmission line or the ground terminal via a leading wire. The leading wire is disposed in a region which does not overlap the first coil sections and the second coil sections. Since even the leading wire could act as a coil in a frequency domain of a GHz band, by disposing the leading wire in this way, it is expected that the influence of the leading wire on the electromagnetic coupling of the unbalanced transmission line and the balanced transmission line is reduced.

More preferably, the capacitor is disposed adjacent to the ground terminal. Consequently, because the leading wire is hardly provided, the influence of the leading wire on the electromagnetic coupling of the unbalanced transmission line and the balanced transmission line is reduced.

For example, the pair of first coil sections are disposed side by side on the same surface, the pair of second coil sections are disposed to be opposed to the pair of first coil sections, and the capacitor is disposed to be symmetrical with respect to an imaginary line which divides the pairs of coil sections into individual coil sections. It is expected that the arrangement of a capacitor symmetrical with respect to an imaginary line which divides left and right coils is suitable for balanced transmission characteristics which are required to have symmetry.

According to the present invention, the capacitor is disposed in the region which does not overlap the first coil sections and the second coil sections in order to reduce the influence on the electromagnetic coupling of the unbalanced transmission line and the balanced transmission line. Therefore, the balanced transmission characteristics of the thin film balun are improved.

DETAILED DESCRIPTION OF THE PREFERRED EMBODIMENTS

Figure 1:
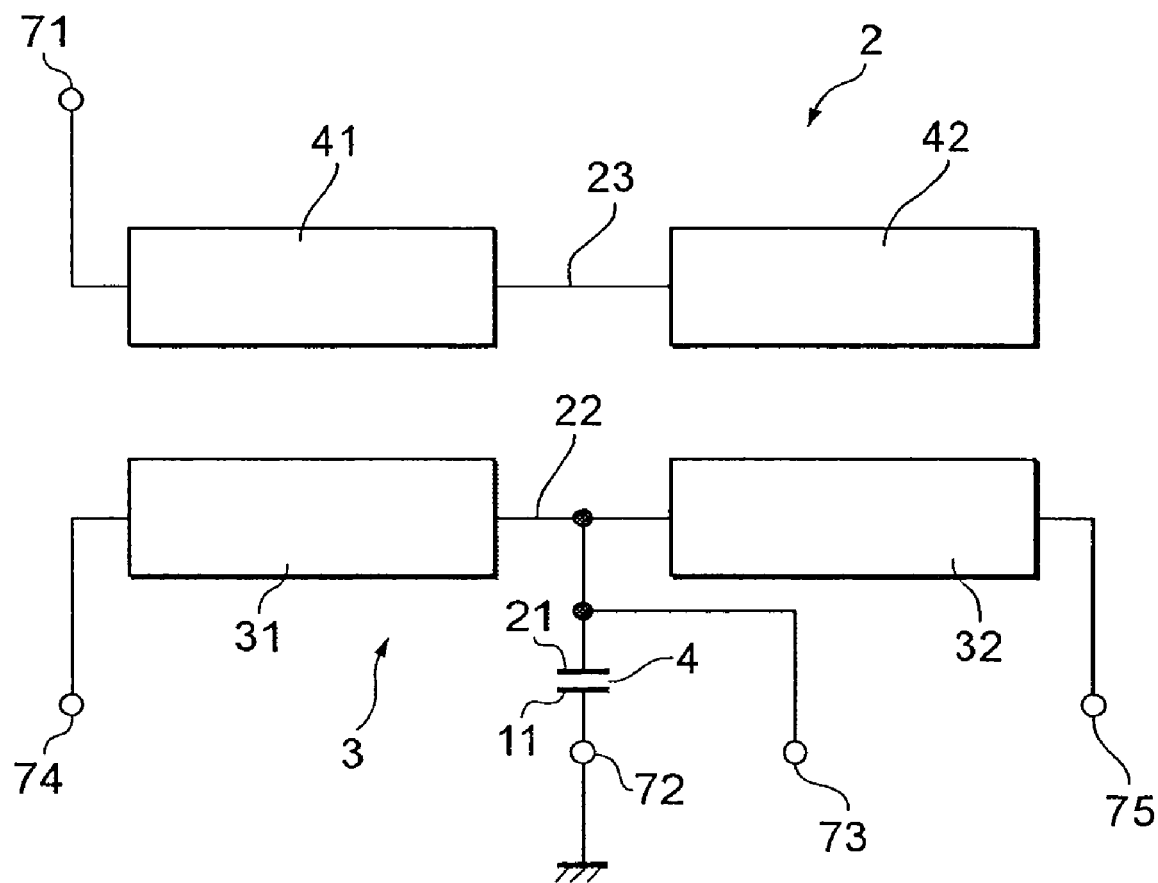
FIG. 1 is an equivalent circuit diagram of a thin film balun 1 according to an embodiment of the present invention.

Embodiments of the present invention will be described below with reference to the drawings. In the drawings, the same reference characters are applied to identical elements, and repeated explanation thereof is omitted. The positional relationship in the up/down/left/right directions is, except if otherwise mentioned, based on the positional relationship illustrated in the drawings. The dimension ratio in the drawings is not limited thereto. The following embodiments are merely exemplary of the present invention, and are not be construed to limit the scope of the present invention. Further, many modifications to the embodiments are possible without departing from the gist of the invention.

FIG. 1 is an equivalent circuit diagram of a thin film balun 1 according to an embodiment of the present invention.

As illustrated in FIG. 1, an unbalanced transmission line 2 includes a coil 41, a coil 42, and a leading wire 23 which connects the coil 41 and the coil 42. One end of the unbalanced transmission line 2 is connected to an unbalanced signal terminal 71. The other end of the unbalanced transmission line 2 is opened. A balanced transmission line 3 includes a coil 31, a coil 32, and a leading wire 22 which connects the coil 31 and the coil 32. One ends of the two coils 31 and 32 are connected to a ground terminal 72 via a leading wire 22 and a capacitor 4. The other ends of the two coils 31 and 32 are connected to balanced signal terminals 74 and 75, respectively.

As described above, the thin film balun 1 includes the unbalanced transmission line 2 including the adjacent pair of coils 41 and 42, the balanced transmission line 3 including the pair of coils 31 and 32, which are disposed to be opposed to the respective coils 41 and 42 of the unbalanced transmission line 2, and electromagnetically coupled to the unbalanced transmission line 2, the capacitor 4, one end of which is connected to the balanced transmission line 3, and the ground terminal 72 connected to the other end of the capacitor 4. Further, the thin film balun 1 includes, as other terminals, the unbalanced signal terminal 71, the DC supply terminal 73, the balanced signal terminals 74 and 75, and an NC (Non-Connection) terminal 76.

Basic operation of the thin film balun 1 will be described with reference to FIG. 1.

In the thin film balun 1, when an unbalanced signal is input to the unbalanced signal terminal 71, the unbalanced signal propagates through the coil 41, the leading wire 23, and the coil 42. The coil 41 is electromagnetically coupled to the coil 31 and the coil 42 is electromagnetically coupled to the coil 32, whereby the unbalanced signal is converted into two balanced signals having phases 180° different from each other. The two balanced signals are output from the balanced signal terminals 74 and 75. At this point, bias voltage is applied to the DC supply terminal 73, whereby the balanced signals are amplified and output. Operation for converting the balanced signals into the unbalanced signal is the opposite of the operation described above.

As it is evident from the operation of the balun described above, balanced transmission characteristics of the balun are important elements. The balanced transmission characteristics are evaluated higher as the shift of the phases of the two balanced signals is, closer to 180° and the intensities of the two balanced signals are closer to each other. While some points are still unclear concerning details of operation mechanism, the present inventors have found that the arrangement of the bias supply capacitor affects the balanced transmission characteristics of the balun.

Figure 2:
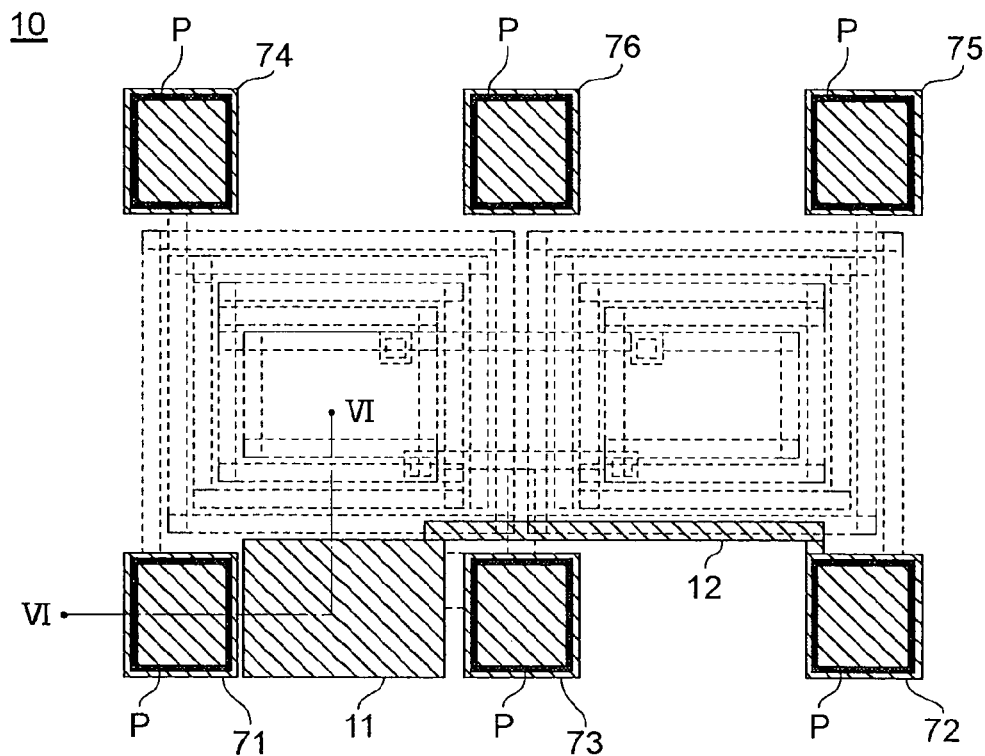
FIG. 2 is a plan view illustrating a first wiring layer 10 of the thin film balun 1.
Figure 3:
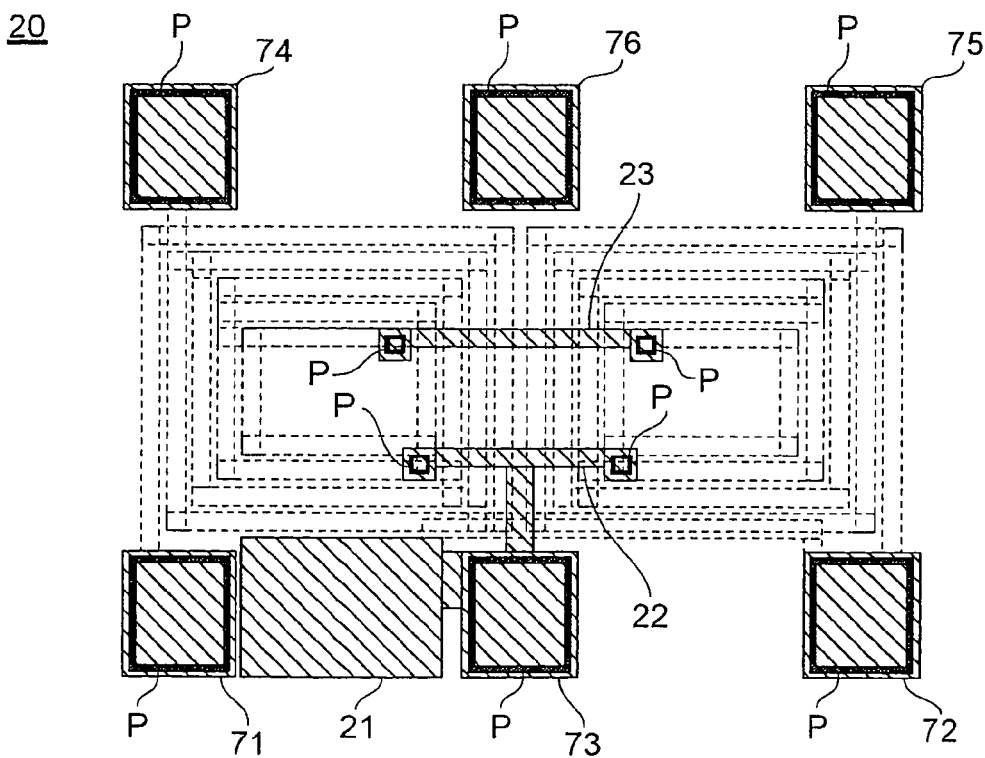
FIG. 3 is a plan view illustrating a second wiring layer 20 of the thin film balun 1.
Figure 4:
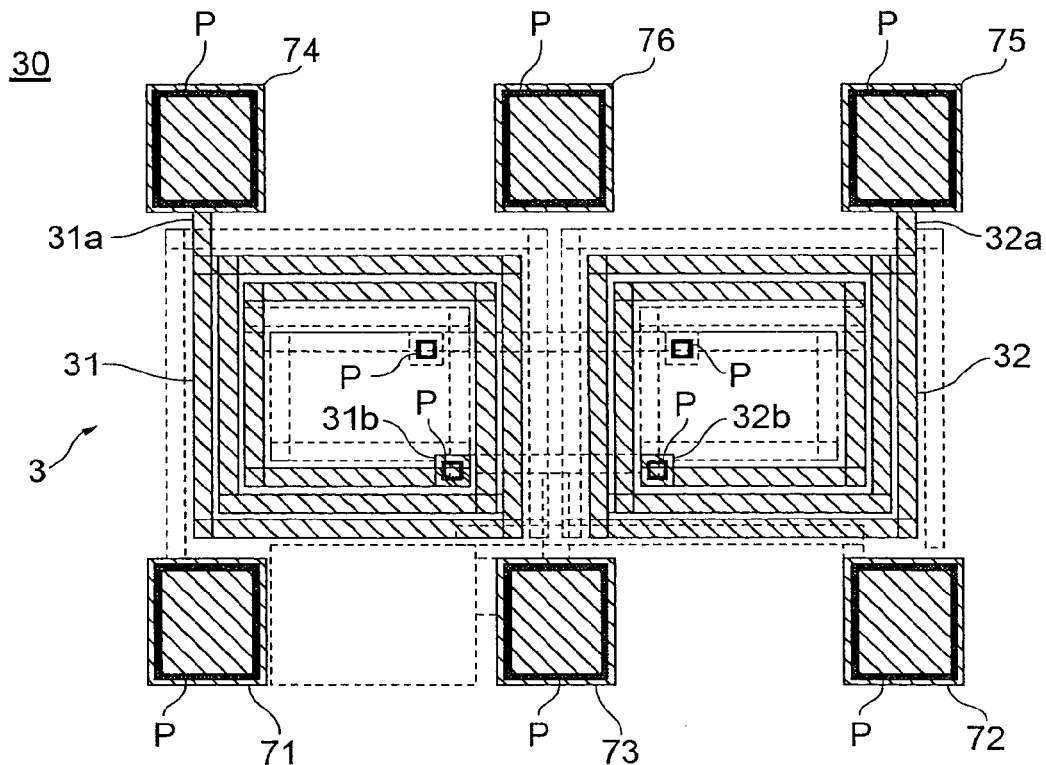
FIG. 4 is a plan view illustrating a third wiring layer 30 of the thin film balun 1.
Figure 5:
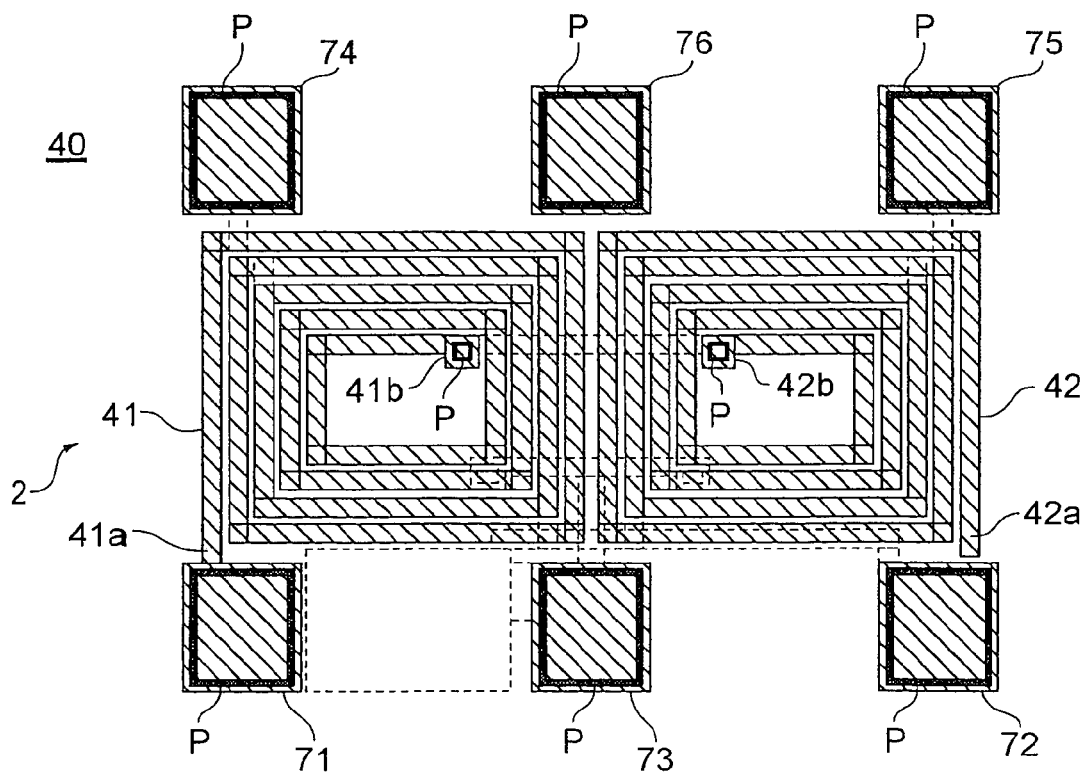
FIG. 5 is a plan view illustrating a fourth wiring layer 40 of the thin film balun 1.
Figure 6:
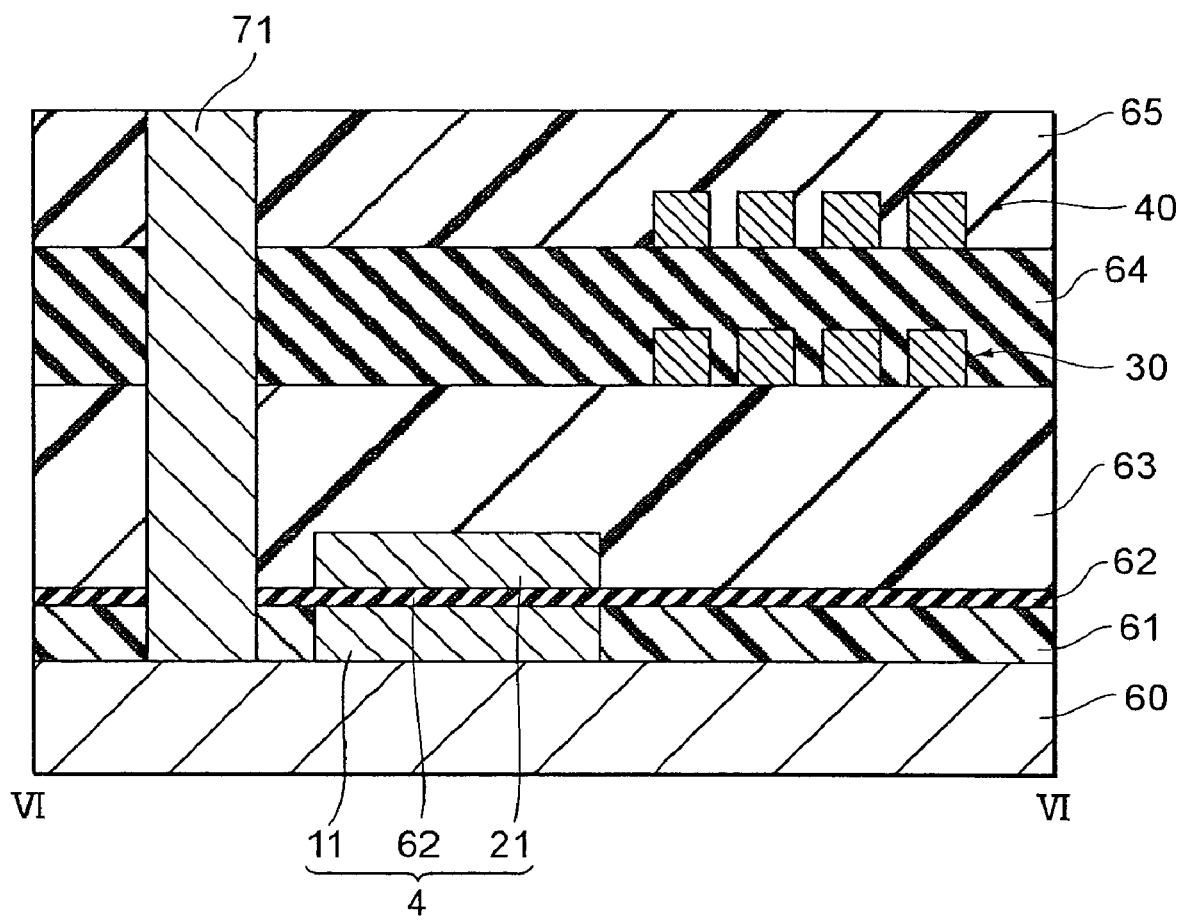
FIG. 6 is a schematic sectional view illustrating the wiring structure of the thin film balun.

FIGS. 2 to 5 are plan views of respective wiring layers of the thin film balun 1. FIG. 2 is a plan view of a first wiring layer 10, FIG. 3 is a plan view of a second wiring layer 20, FIG. 4 is a plan view of a third wiring layer 30, and FIG. 5 is a plan view of a fourth wiring layer 40. The first wiring layer 10 is a bottom wiring layer and the fourth wiring layer 40 is a top wiring layer. FIG. 6 is a schematic sectional view of the thin film balun 1 along VI-VI line in FIG. 2.

As illustrated in FIGS. 2 to 5, the unbalanced signal terminal 71, ground terminal 72, DC supply terminal 73, balanced signal terminals 74 and 75, and NC terminal 76 are formed in all of the first to fourth wiring layers 10 to 40. The terminals 71 to 76 are electrically connected via through holes P between the different layers. Metal plating is formed in all the through holes P illustrated in FIGS. 2 to 4 so that electrical conduction between the layers is made. The structure of the wiring layers will be described in detail below.

As illustrated in FIG. 2, a lower electrode 11 of the capacitor 4 is formed in the first wiring layer 10. The lower electrode 11 is connected to the ground terminal 72 via a leading wire 12. As described later, the lower electrode 11 is disposed in a region which does not overlap the coils 41 and 42 included in the unbalanced transmission line 2 and the coils 31 and 32 included in the balanced transmission line 3. More specifically, the lower electrode 11 is disposed in a region around the coils 31 and 41 and between the DC supply terminal 73 and the unbalanced signal terminal 71.

As illustrated in FIG. 3, an upper electrode 21 disposed to be opposed to the lower electrode 11 is formed in the second wiring layer 20. The upper electrode 21 is connected to the DC supply terminal 73. The capacitor 4 includes the lower electrode 11, the upper electrode 21, and a dielectric film between the lower electrode 11 and the upper electrode 21. Two leading wires 22 and 23 are formed in the second wiring layer 20. The leading wire 22 is connected to the DC supply terminal 73.

In the third wiring layer 30, as illustrated in FIG. 4, two coils 31 and 32 (a pair of second coil sections) constituting the balanced transmission line 3 are formed adjacent to each other. The coils 31 and 32 are equivalent to a ¼ wavelength resonator. An outer end 31a of the coil 31 is connected to the balanced signal terminal 74. An inner end 31b of the coil 31 is connected to the through hole P. An outer end 32a of the coil 32 is connected to the balanced signal terminal 75. An inner terminal 32b of the coil 32 is connected to the through hole P. The end 31b of the coil 31 and the end 32b of the coil 32 are connected to each other via the through hole P and the leading wire 22 of the second wiring layer 20.

In the fourth wiring layer 40, as illustrated in FIG. 5, two coils 41 and 42 (a pair of first coil sections) constituting the unbalanced transmission line 2 are formed adjacent to each other. The coils 41 and 42 are equivalent to a ¼ wavelength resonator. An end 41a in the outer side of the coil 41 is connected to the unbalanced signal terminal 71, and an end 41b in the inner side of the coil 41 is connected to a through hole P. An end 42b in the inner side of the coil 42 is connected to a through hole P, and an end 42a in the outer side of the coil 42 is open. The end 41b of the coil 41 and the end 42b of the coil 42 are connected to each other via the through hole P and the leading wire 23. The coils 41 and 42 of the unbalanced transmission line 2 are disposed to be opposed to the coils 31 and 32 of the balanced transmission line 3 and are electromagnetically coupled in sections opposed to each other to configure a coupler.

If the explanation made with reference to FIGS. 2 to 5 is put in another way in light of FIG. 1, the thin film balun according to this embodiment has the unbalanced circuit, and the unbalanced circuit includes the transmission line (the first coil section) having the structure in which the pair of ¼ wavelength circuits are connected. One ¼ wavelength circuit included in the unbalanced circuit is connected to the unbalanced signal terminal, and the other ¼ wavelength circuit is connected to the open end.

This thin film balun has the balanced circuit electromagnetically coupled to the unbalanced circuit. The balanced circuit includes the transmission line (the second coil section) included in the pair of ¼ wavelength circuit. One end of one ¼ wavelength circuit included in the balanced circuit is connected to the balanced signal terminal and the other end thereof is connected to one end of the other ¼ wavelength circuit included in the balanced circuit. The other end of the other ¼ wavelength circuit included in the balanced circuit is connected to the balanced signal terminal. One point between the pair of ¼ wavelength circuits included in the balanced circuit is connected to one end of the capacitor and the DC supply terminal. The other end of the capacitor is connected to the ground terminal.

In such circuit structure, the capacitor is disposed in a region which does not overlap the first coil sections and the second coil sections.

As illustrated in FIG. 6, the first wiring layer 10 to the fourth wiring layer 40 are formed on a substrate 60 made of, for example, alumina. A material and a manufacturing method of the wiring layers 10 to 40 are not limited. However, for example, the wiring layers 10 to 50 are formed by the sputtering, the CVD, the electroplating, or the electroless plating and are made of a material such as Ag, Cu, or Al. Dielectric films 61 to 65 are formed among the respective wiring layers 10 to 40. A material of the dielectric films 61 to 65 is not specifically limited. However, for example, polyimide, photosensitive resin, or the like is used as the dielectric films 61, 63 and 65. For the dielectric film 62 between the first wiring layer 10 in which the lower electrode 11 of the capacitor 4 is formed and the second wiring layer 20 in which the upper electrode 21 of the capacitor 4 is formed, for example, silicon nitride, oxide silicon, or alumina is used. For the dielectric film 64 between the third wiring layer 30 in which the balanced transmission line 3 is formed and the fourth wiring layer 40 in which unbalanced transmission line 2 is formed, for example, silicon nitride, oxide silicon, or alumina is used.

In this embodiment, the capacitor 4 is formed in a lowermost layer, i.e., a layer lower than the layers in which the unbalanced transmission line 2 and the balanced transmission line 3 are formed. Such structure is preferable for a thin film process because a component which is smaller and can be highly integrated can be easily manufactured. When a capacitor and a coil are formed adjacent to each other, a capacitor forming region and a coil forming region cannot be set closer to each other to the limit. However, in this embodiment, there is an advantage that the coil forming region and the capacitor forming region can be set closer to each other to the limit.

As described above, in this embodiment, the capacitor 4 is disposed in the region which does not overlap the coils 31, 32, 41, and 42 included in the unbalanced transmission line 2 and the balanced transmission line 3. While some points are still unclear concerning details of operation mechanism, the present inventors have found that the arrangement of the bias supply capacitor affects the characteristics of the balun.

Figure 7:
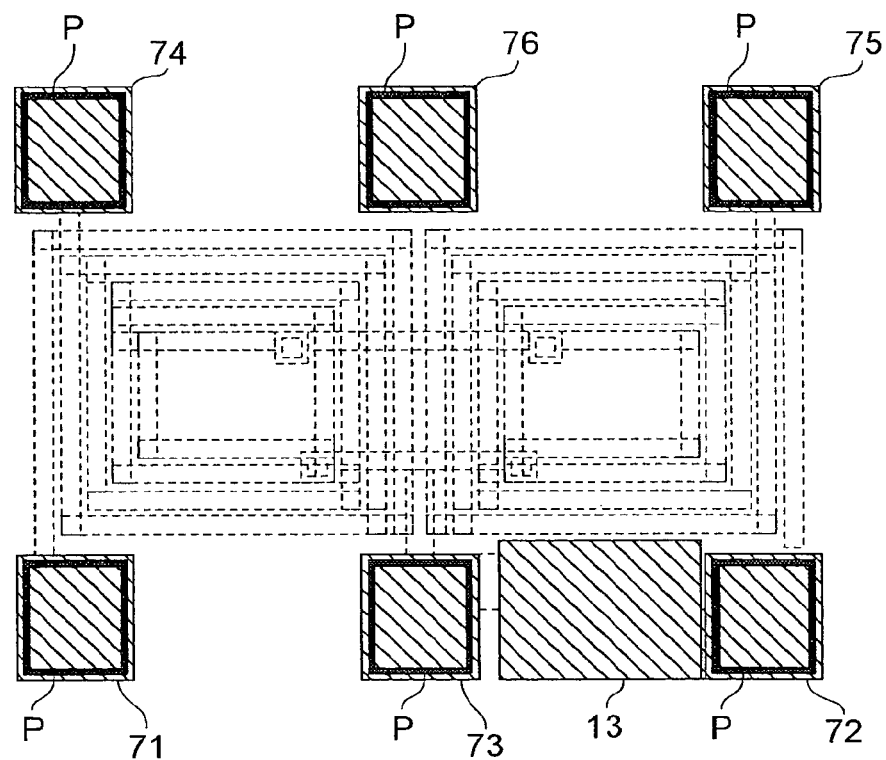
FIG. 7 is a plan view illustrating a capacitor electrode in the thin film balun 1 of Example 2.
Figure 8:
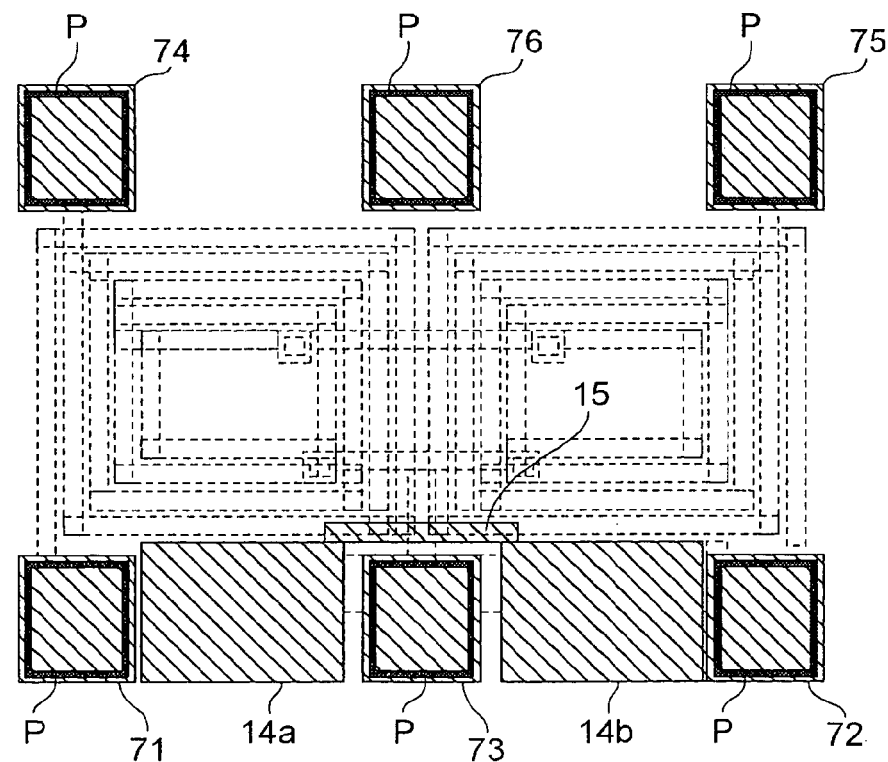
FIG. 8 is a plan view illustrating a capacitor electrode in the thin film balun 1 of Example 3.
Figure 9:
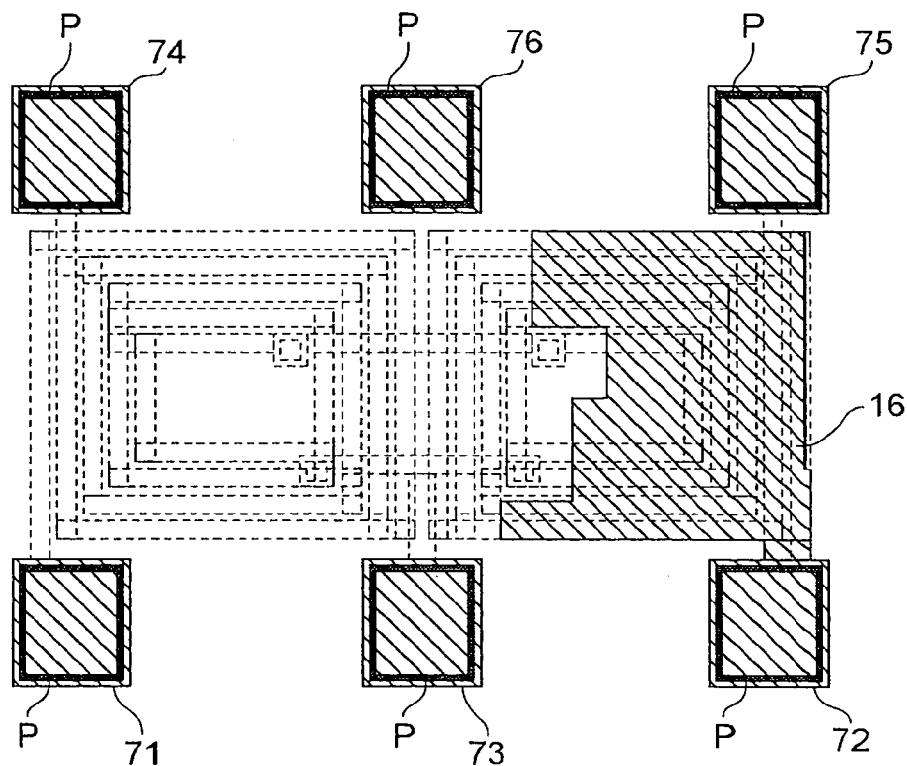
FIG. 9 is a plan view illustrating a capacitor electrode in the thin film balun 1 of Comparative example 1.
Figure 10:
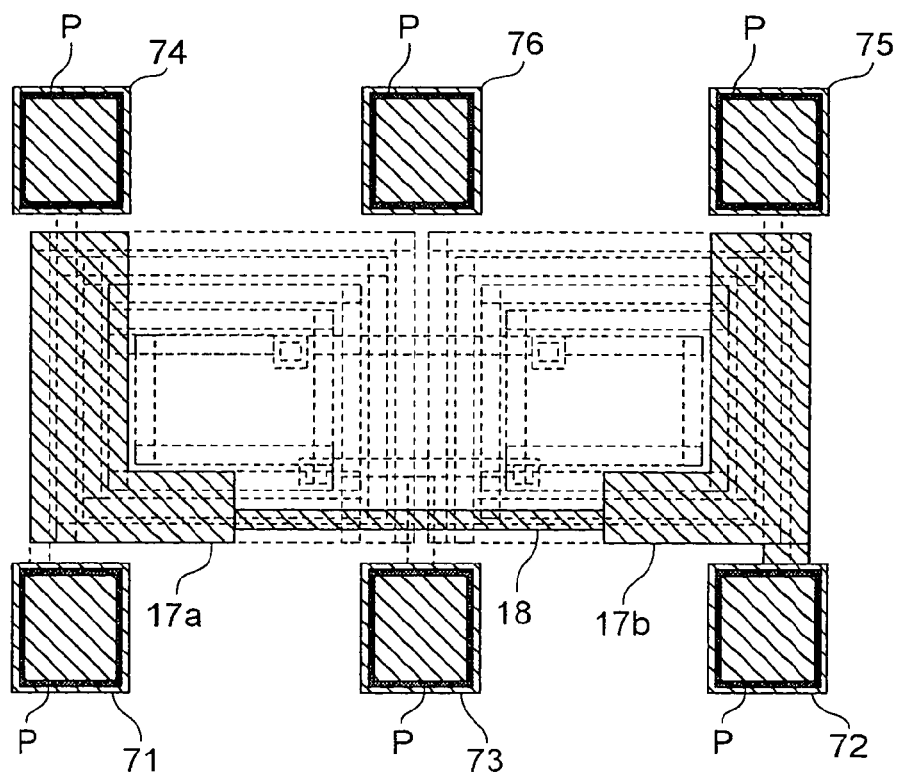
FIG. 10 is a plan view illustrating a capacitor electrode in the thin film balun 1 of Comparative example 2.

In the following description, balanced transmission characteristics of a thin film balun are calculated concerning Examples 1 to 3 and Comparative examples 1 and 2 in which the arrangement of the capacitor 4 is changed. FIGS. 7 and 8 are plan views illustrating a lower electrode of a capacitor in Examples 2 to 3. FIGS. 9 and 10 are plan views illustrating a lower electrode of a capacitor in Comparative examples 1 and 2. An arrangement region of the lower electrode illustrated in FIGS. 7 to 10 means an arrangement region of an upper electrode disposed to be opposed to the lower electrode and an arrangement region of a capacitor. The arrangement of the capacitor in the examples and the comparative examples will be described below.

Example 1

In the thin film balun 1 in Example 1, as illustrated in FIG. 2, the lower electrode 11 is disposed in a region around the coils and between the DC supply terminal 73 and the unbalanced signal terminal 71. The leading wire 12 which connects the lower electrode 11 and the ground terminal 72 overlaps the coils.

Example 2

In Example 2, as illustrated in FIG. 7, the lower electrode 13 is disposed in a region around the coils and between the DC supply terminal 73 and the ground terminal 72. In this case, the lower electrode 13 and the ground terminal 72 are connected without the intervention of a long leading wire.

Example 3

In Example 3, as illustrated in FIG. 8, lower electrodes 14a and 14b of the capacitor 4 are disposed to be symmetrical with respect to an imaginary line which divides the left and right coils into the individual coils (equal to an imaginary line connecting the NC terminal 76 and the DC supply terminal 73). The lower electrodes 14a and 14b are connected to each other via a leading wire 15. The lower electrode 14b is connected to the ground terminal 72.

Comparative Example 1

In Comparative example 1, as illustrated in FIG. 9, a lower electrode 16 of the capacitor 4 is disposed to overlap the coil and the coil opening on one side.

Comparative Example 2

In Comparative example 2, as illustrated in FIG. 10, lower electrodes 17a and 17b of the capacitor 4 are disposed not to overlap the coil openings but to overlap the coils. The lower electrodes 17a and 17b of the capacitor 4 are disposed to be symmetrical with respect to the imaginary line which divides the left and right coils into the individual coils (equal to the imaginary line connecting the NC terminal 76 and the DC supply terminal 73). The lower electrodes 17a and 17b are connected to each other via a leading wire 18. The lower electrode 17b is connected to the ground terminal 72.

Evaluation Result

Figure 11:
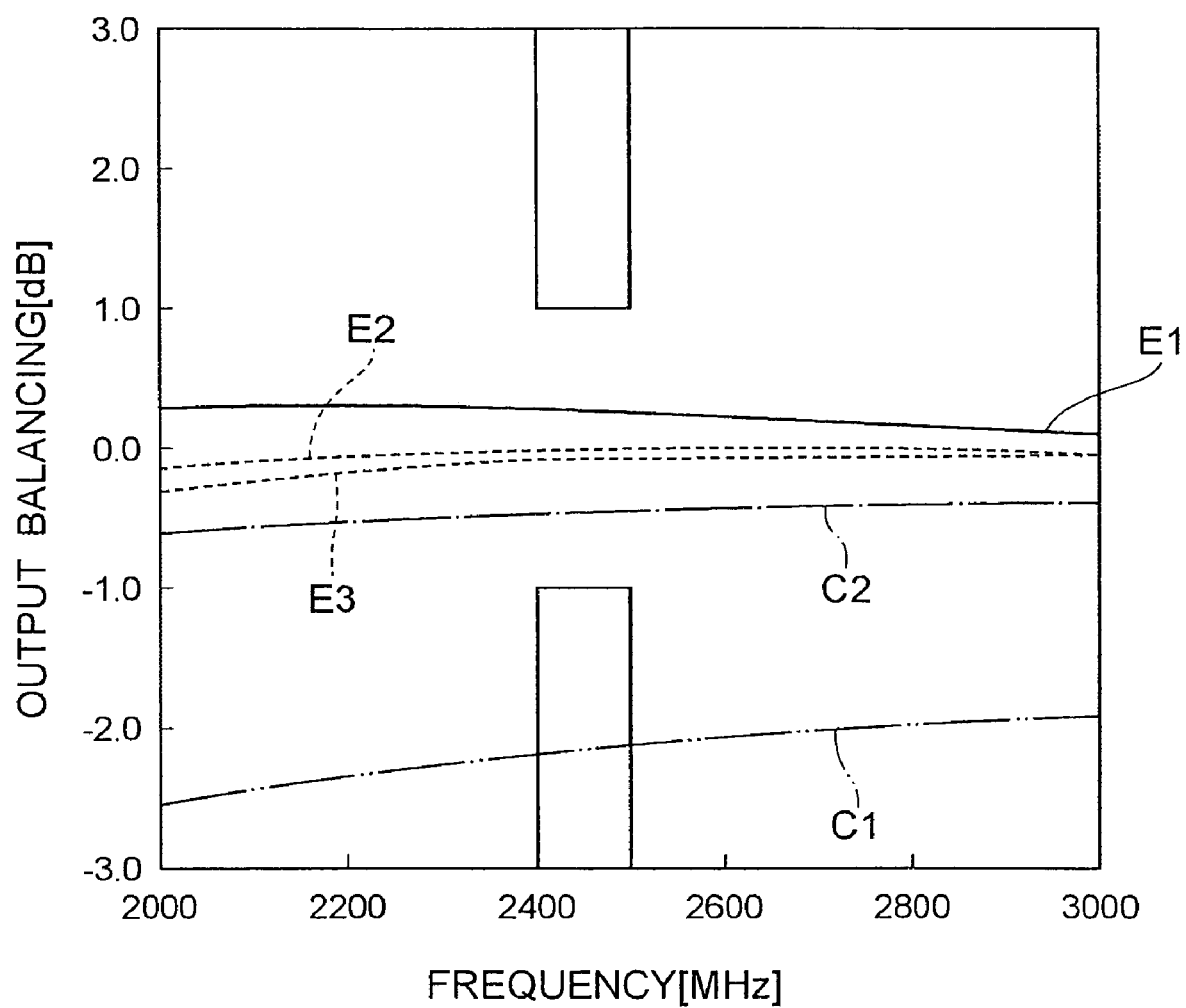
FIG. 11 is a graph illustrating a comparison result of output balancing of Examples 1 to 3 and Comparative examples 1 and 2.

Concerning the structure of Examples 1 to 3 and the structure of Comparative examples 1 and 2, output balancing of two balanced signals was calculated by simulation. A target frequency was set to 2400 MHz to 2500 MHz. In the following evaluation, the output balancing equal to or higher than −1.0 dB and equal to or lower than 1.0 dB is set as an acceptance criterion. Results are illustrated in FIG. 11. Since an output balancing characteristic illustrated in FIG. 11 is an amplitude difference of output from the balanced signal terminal 74 and the balanced signal terminal 75, 0 dB is more ideal output balancing. In FIG. 11, E1 indicates a result of Example 1, E2 indicates a result of Example 2, E3 indicates a result of Example 3, C1 indicates a result of Comparative example 1, and C2 indicates a result of Comparative example 2.

As illustrated in FIG. 11, it is seen that the output balancing is excellent in all Examples 1 to 3 in which the capacitor is disposed not to overlap the coils compared with Comparative examples 1 and 2. While some points are still unclear concerning details of operation mechanism, it is expected that the influence on the balanced transmission characteristic is reduced by disposing the capacitor not to overlap the coils.

Among Examples 1 to 3, Example 2 is most excellent in output balancing. Since even the leading wire could act as a coil in a frequency domain of a GHz band, it is expected that the influence of the leading wire on the balanced transmission characteristic is further reduced by eliminating the leading wire which overlaps the coils.

It is seen that Example 3 is also excellent in output balancing, although inferior to Example 2. It is expected from this result that the arrangement of the capacitor symmetrical with respect to the imaginary line which divides the left and right coils is suitable for balanced transmission characteristics which are required to have symmetry.

Comparative example 1 does not meet the criterion. However, Comparative example 2 meets the criterion, although the output balancing thereof is inferior to that of Example 1.

The evaluation result indicates that the arrangement of the capacitor described in this embodiment improves the characteristics of the thin film balun 1.

As described above, the present invention is not limited to the embodiments described above, and many modifications to the embodiments are possible without departing from the gist of the invention. For example, the arrangement of the terminals 71 to 76 is not limited; for example, the NC terminal 76 can be used as the ground terminal. The number of wiring layers constituting the thin film balun 1 may be smaller than four or equal to or larger than five. Further, the same effect is achieved in a structure having the exact opposite layer composition, such as an example where the capacitor is formed in the uppermost layer, and the unbalanced electrode in the lowermost layer. Further, the coil arrangement is not limited; for example, a thin film balun structure may be used in which the four coils 31, 32, 41 and 42 of the unbalanced transmission line 2 and balanced transmission line 3 are all stacked, and only one coil opening is defined.

The thin film balun according to the present invention, which allows improvement in the balanced transmission characteristics of the thin film balun with a bias supply capacitor, can be used particularly in radio communication apparatuses requiring miniaturization.

What is claimed is:

1. A thin film balun comprising:
    an unbalanced transmission line which includes a pair of first coil sections;
    a balanced transmission line which includes a pair of second coil sections and is electromagnetically coupled to the unbalanced transmission line, the pair of second coil sections being disposed on a different layer from the first coil sections;
    a DC supply terminal which is connected to the balanced transmission line and supplies a DC bias;
    a capacitor having one end connected to the balanced transmission line and the DC supply terminal; and
    a ground terminal connected to the other end of the capacitor, wherein
    the capacitor is disposed in a region which does not overlap the first coil sections and the second coil sections.

2. The thin film balun according to claim 1, wherein
    the capacitor is connected to the balanced transmission line or the ground terminal via a leading wire, and
    the leading wire is disposed in a region which does not overlap the first coil sections and the second coil sections.

3. The thin film balun according to claim 1, wherein the capacitor is disposed adjacent to the ground terminal.

4. The thin film balun according to claim 1, wherein
    the pair of first coil sections are disposed side by side on the same surface,
    the pair of second coil sections are disposed to be opposed to the pair of first coil sections, and
    the capacitor is disposed to be symmetrical with respect to an imaginary line which divides the pairs of coil sections into individual coil sections.

* * * * *